United States Patent
Lim

(10) Patent No.: US 12,175,942 B2
(45) Date of Patent: Dec. 24, 2024

(54) PROBE MODULE FOR INSPECTING DISPLAY PANEL, PANEL INSPECTION APPARATUS INCLUDING THE SAME, AND PANEL CORRECTION METHOD OF PANEL INSPECTION APPARATUS

(71) Applicant: LX Semicon Co., Ltd., Daejeon (KR)

(72) Inventor: Ho Min Lim, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 17/531,160

(22) Filed: Nov. 19, 2021

(65) Prior Publication Data
US 2022/0165221 A1 May 26, 2022

(30) Foreign Application Priority Data

Nov. 25, 2020 (KR) .................. 10-2020-0159807

(51) Int. Cl.
*G09G 3/3291* (2016.01)
*G01R 31/26* (2020.01)

(52) U.S. Cl.
CPC ....... *G09G 3/3291* (2013.01); *G01R 31/2635* (2013.01); *G09G 2300/0819* (2013.01); *G09G 2300/0842* (2013.01); *G09G 2310/0294* (2013.01); *G09G 2320/029* (2013.01); *G09G 2330/10* (2013.01); *G09G 2360/16* (2013.01)

(58) Field of Classification Search
CPC .... G09G 3/006; G09G 3/3233; G09G 3/3291; G09G 2300/0842; G09G 2300/0861; G09G 2300/0819; G09G 2310/0297; G09G 2320/043; G09G 2320/029; G09G 2320/0233
See application file for complete search history.

(56) References Cited

U.S. PATENT DOCUMENTS

| | | | |
|---|---|---|---|
| 9,007,354 B2 | 4/2015 | Park et al. | |
| 9,384,696 B2 | 7/2016 | Okuno et al. | |
| 2006/0187722 A1* | 8/2006 | Han | G09G 3/20 365/200 |
| 2010/0225770 A1* | 9/2010 | Morimoto | G09G 3/325 29/854 |
| 2012/0013592 A1 | 1/2012 | Park et al. | |
| 2012/0147070 A1* | 6/2012 | Segawa | G09G 3/006 345/694 |
| 2014/0368415 A1* | 12/2014 | Kim | G09G 3/3233 345/77 |

(Continued)

FOREIGN PATENT DOCUMENTS

| | | |
|---|---|---|
| KR | 10-1696475 B1 | 1/2017 |
| KR | 10-2017-0135526 A | 12/2017 |

(Continued)

*Primary Examiner* — Dong Hui Liang
(74) *Attorney, Agent, or Firm* — ROTHWELL, FIGG, ERNST & MANBECK, P.C.

(57) ABSTRACT

Provided are a probe module for inspecting a display panel, a panel inspection apparatus including the same, and a panel correction method of the panel inspection apparatus, which are provided to correct a display panel selected as a defective display panel during manufacturing of the display panel, thereby improving manufacturing yield of the display panel.

6 Claims, 8 Drawing Sheets

(56) References Cited

U.S. PATENT DOCUMENTS

| | | | |
|---|---|---|---|
| 2015/0097872 A1* | 4/2015 | Jeong | G09G 3/3225 |
| | | | 345/77 |
| 2015/0154910 A1 | 6/2015 | Okuno et al. | |
| 2015/0181182 A1* | 6/2015 | Lin | H04N 9/3182 |
| | | | 348/453 |
| 2016/0012798 A1* | 1/2016 | Oh | G09G 3/3283 |
| | | | 345/82 |
| 2018/0005556 A1* | 1/2018 | Xu | G09G 3/3225 |
| 2022/0301469 A1* | 9/2022 | Staten | G09G 5/006 |

FOREIGN PATENT DOCUMENTS

| | | |
|---|---|---|
| KR | 10-1965790 B1 | 4/2019 |
| KR | 10-2215204 B1 | 2/2021 |

\* cited by examiner

# PROBE MODULE FOR INSPECTING DISPLAY PANEL, PANEL INSPECTION APPARATUS INCLUDING THE SAME, AND PANEL CORRECTION METHOD OF PANEL INSPECTION APPARATUS

CROSS REFERENCE TO RELATED APPLICATION

This application claims priority from Korean Patent Application No. 10-2020-0159807, filed on Nov. 25, 2020 which is hereby incorporated by reference for all purposes as if fully set forth herein.

BACKGROUND OF THE DISCLOSURE

Field of the Disclosure

The present disclosure relates to a probe module for inspecting a display panel, a panel inspection apparatus including the same, and a panel correction method of the panel inspection apparatus.

Related Art

In general, an organic light emitting display device displays a desired image by controlling OLED pixels arranged in a matrix form by individually supplying data voltages according to image information to the OLED pixels.

A panel applied to the organic light emitting display device, i.e., a display panel in which OLED pixels are arranged, has a wide range of applications due to characteristics that it is light in weight, has a small thickness, and is driven with low power.

Recently, the above display panel has been used in small electronic devices that display a small screen, such as a tablet PC or a smartphone.

Meanwhile, a manufacturing process of the display panel includes a light emission test for inspecting whether the panel is defective.

In the light emission test, a light emission state of pixels arranged in the display panel is determined with the naked eye or through a camera, and a display panel having a luminance deviation (e.g., screen spot) between pixels is treated as being defective.

In addition, integrated circuits (ICs) such as a source driver IC, a gate driver IC, and a timing controller are mounted on the display panel that has passed the emission test, i.e., a display panel in which there is no luminance deviation between pixels.

As described above, the existing manufacturing process includes only the light emission test for selecting a defective display panel and does not include a process for correcting the defective display panel, manufacturing yield of the display panel may be reduced.

SUMMARY OF THE DISCLOSURE

The present disclosure provides a technology for correcting a display panel selected as a defective display panel during manufacturing of the display panel, thereby improving manufacturing yield of the display panel.

In an aspect, a probe module includes a data driving circuit configured to receive image data for a driving test of a display panel from a compensation value generating circuit of a panel inspection apparatus, generate a data voltage corresponding to the image data, and supply the data voltage to a plurality of pixels arranged on the display panel, a pixel sensing circuit configured to sense a characteristic value generated in each of the plurality of pixels receiving the data voltage, generate pixel sensing data including a characteristic value of each of the plurality of pixels, and transmit the generated pixel sensing data to the compensation value generating circuit, and a panel connection circuit configured to electrically connect the data driving circuit to the plurality of pixels and electrically connect the pixel sensing circuit to the plurality of pixels.

In another aspect, a panel inspection apparatus includes a probe module configured to sense a characteristic value generated in each of a plurality of pixels and generate and transmit pixel sensing data including the characteristic value of each of the plurality of pixels during a driving test of a display panel in which a plurality of pixels are arranged, a compensation value generating circuit configured to receive the pixel sensing data from the probe module, select one or more pixels having a characteristic value deviation from the plurality of pixels using the pixel sensing data, and generate compensation value data for compensating for the characteristic value deviation of the one or more pixels during the driving test, and a communication circuit configured to transmit the compensation value data to a memory of an integrated circuit (IC) mounted on the display panel after the testing of driving.

In another aspect, a panel correction method of a panel inspection apparatus includes: a panel connection operation in which a display panel on which an integrated circuit (IC) is not mounted is electrically connected, a panel driving operation in which a data voltage for a driving test of the display panel is supplied to a plurality of pixels arranged on the display panel, a pixel sensing operation in which a characteristic value generated in each of the plurality of pixels receiving the data voltage is sensed, a compensation value generating operation in which one or more pixels having a characteristic value deviation, among the respective characteristic values of the plurality of pixels are selected and compensation value data for compensating for the characteristic value deviation of the one or more pixels is generated, and a data storing operation in which the compensation value data is stored in a memory included in the IC.

As described above, according to the present embodiment, the panel inspection apparatus senses characteristics of the pixels arranged on the display panel and generates compensation value data for a luminance deviation of the display panel, and thus, a defective display panel may be corrected during a manufacturing process of the display panel, thereby improving manufacturing yield of the display panel.

DESCRIPTION OF EMBODIMENTS

First, a configuration of a general display device will be first described before describing an inspection apparatus according to an embodiment.

Figure 1:
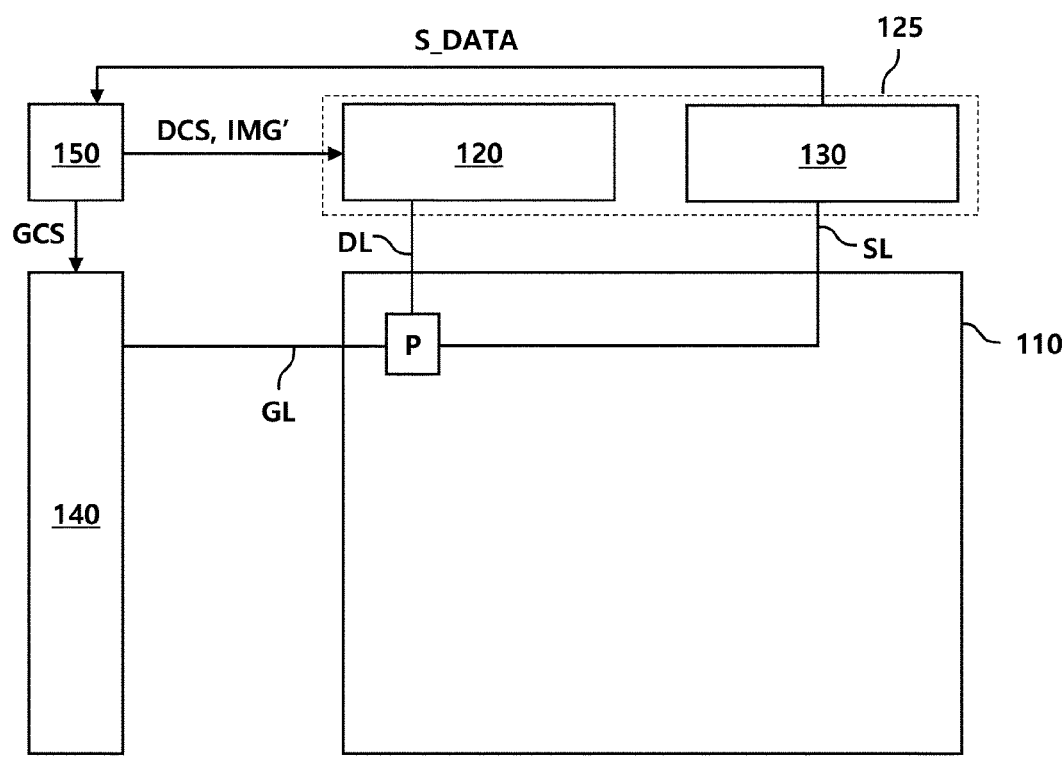
FIG. 1 is a block diagram of a general display device.

FIG. 1 is a block diagram of a general display device.

Referring to FIG. 1, the general display device 100 may include a display panel 110 and panel driving devices 120, 130, 140, and 150 for driving the display panel 110.

A plurality of data lines DL, a plurality of gate lines GL, and a plurality of pixel sensing lines SL may be arranged on the display panel 110, and a plurality of pixels P may be arranged on the display panel 110. Here, the plurality of pixels P may be arranged in a matrix form including a plurality of rows and a plurality of columns The devices 120, 130, 140, and 150 for driving at least one component included in the display panel 110 may be referred to as panel driving devices. For example, the data driving circuit 120, the pixel sensing circuit 130, the gate driving circuit 140, and the data processing circuit 150 may be referred to as a panel driving device.

Each of the circuits 120, 130, 140, and 150 described above may be referred to as a panel driving device, and all or a plurality of circuits may be referred to as panel driving devices.

In the panel driving device, the gate driving circuit 140 may supply a scan signal of a turn-on voltage or a turn-off voltage to the gate line GL. When the scan signal of the turn-on voltage is supplied to the pixel P, the pixel P is connected to the data line DL, and when the scan signal of the turn-off voltage is supplied to the pixel P, the pixel P and the data line (DL) are disconnected.

Here, the gate driving circuit 140 may be referred to as a gate driver integrated circuit (IC). Although only one gate driving circuit 140 is illustrated in FIG. 1, the general display device 100 may actually include one or more gate driving circuits 140. The gate driving circuit 140 may be designed to be located outside or inside the display panel 110.

In the panel driving device, the data driving circuit 120 supplies a data voltage to the data line DL. The data voltage supplied to the data line DL is transferred to the pixel P connected to the data line DL according to the scan signal.

In the panel driving device, the pixel sensing circuit 130 receives an analog signal (e.g., voltage, current, etc.) formed in each pixel P. The pixel sensing circuit 130 may be connected to each pixel P according to the scan signal or may be connected to each pixel P according to a separate sensing signal. In this case, the separate sensing signal may be generated by the gate driving circuit 140.

The pixels P may include an organic light emitting diode (OLED) and one or more transistors. Characteristics of the OLED and the transistors included in each pixel P may change according to time or a surrounding environment. The general pixel sensing device 130 may sense the characteristics of these components included in each pixel P and transmit the same to a data processing circuit 150 to be described later.

Figure 2:
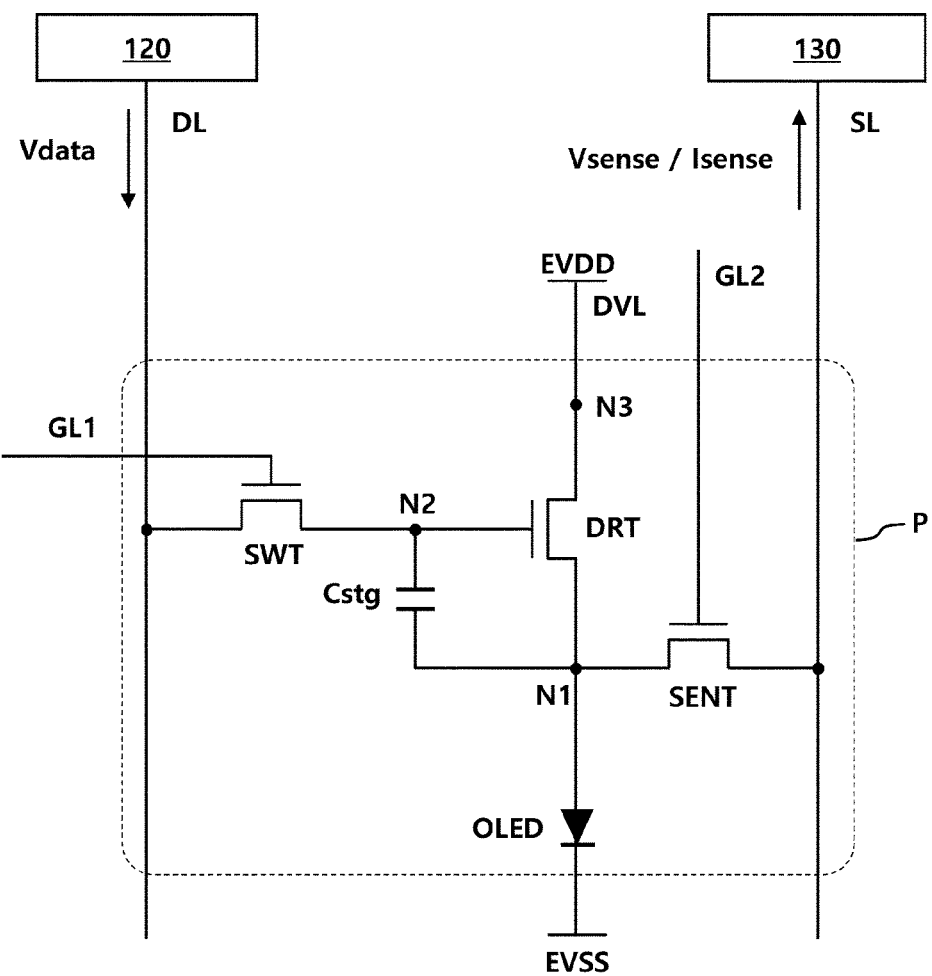
FIG. 2 is a view illustrating a configuration of sensing a pixel in a general display device.

Specifically, the pixel P may include the OLED, a driving transistor DRT, a switching transistor SWT, a sensing transistor SENT, and a storage capacitor Cstg as shown in FIG. 2.

In addition, the OLED may include an anode electrode, an organic layer, and a cathode electrode. Under the control of the driving transistor DRT, the anode electrode is connected to a driving voltage EVDD side and the cathode electrode is connected to a base voltage EVSS to emit light. In other words, as the driving transistor DRT is turned on, a driving current is supplied from the driving voltage EVDD side so that the OLED may emit light and a voltage according to a characteristic of the OLED may be formed between the anode electrode and the cathode.

The driving transistor DRT may control brightness of the OLED by controlling the driving current supplied to the OLED.

A first node N1 of the driving transistor DRT may be electrically connected to the anode electrode of the OLED and may be a source node or a drain node. A second node N2 of the driving transistor DRT may be electrically connected to a source node or a drain node of the switching transistor SWT and may be a gate node. A third node N3 of the driving transistor DRT may be electrically connected to a driving voltage line DVL supplying the driving voltage EVDD and may be a drain node or a source node.

The switching transistor SWT may be electrically connected between the data line DL and the second node N2 of the driving transistor DRT and may be turned on upon receiving a scan signal through the gate lines GL1 and GL2.

When the switching transistor SWT is turned on, a data voltage Vdata supplied from the data driving circuit 120 through the data line DL is transferred to the second node N2 of the driving transistor DRT.

The storage capacitor Cstg may be electrically connected between the first node N1 and the second node N2 of the driving transistor DRT.

The storage capacitor Cstg may be a parasitic capacitor existing between the first node N1 and the second node N2 of the driving transistor DRT or may be an external capacitor intentionally designed outside the driving transistor DRT.

The sensing transistor SENT may connect the first node N1 of the driving transistor DRT to the sensing line SL, and the sensing line SL transfers a reference voltage Vref to the first node N1 and transfer an analog signal (e.g., voltage or current) formed at the first node N1 to the pixel sensing circuit 130.

In addition, the pixel sensing circuit 130 measures a characteristic of the pixel P using an analog signal Vsense or Isense transmitted through the sensing line SL.

When a voltage of the first node N1 is measured, a threshold voltage, mobility, and a current characteristic of the driving transistor DRT may be recognized. In addition, when the voltage of the first node N1 is measured, the degree of degradation of the OLED such as parasitic capacitance and a current characteristic of the OLED may be recognized.

The pixel sensing circuit 130 may measure the voltage of the first node N1, that is, the characteristic values of the pixels P and transmit pixel sensing data, which is digital data including the characteristic value, to the data processing circuit (150 of FIG. 1). In addition, the data processing circuit (150 of FIG. 1) may recognize the characteristic of each pixel P using the pixel sensing data.

The data driving circuit 120 and the pixel sensing circuit 130 as described above may be included in a single IC 125. In addition, the single IC 125 may be referred to as a source driver IC.

Although only a single source driver IC 125 is illustrated in FIG. 1, the general display device 100 may actually include one or more source driver ICs 125.

In the panel driving device, the data processing circuit 150 may supply various control signals to the gate driving circuit 140 and the data driving circuit 120. The data processing circuit 150 may generate a gate control signal GCS for starting a scan according to timing implemented in each frame and transmit the generated gate control signal GCS to the gate driving circuit 140. In addition, the data processing circuit 150 may output image data IMG', which is obtained by converting image data IMG input from an external according to a data signal format used in the data driving circuit 120, to the data driving circuit 120. Also, the data processing circuit 150 may transmit a data control signal DCS for controlling the data driving circuit 120 to supply a data voltage to each pixel P according to each timing.

In addition, the data processing circuit 150 may compensate for the image data IMG' according to the characteristic of the pixel P. In this case, the data processing circuit 150 may receive pixel sensing data S_DATA from the pixel sensing circuit 130. Further, the data processing circuit 150 may generate compensation value data using the pixel sensing data S_DATA and compensate for the image data IMG' using the compensation value data. Here, the pixel sensing data S_DATA may include a characteristic value for the characteristic of the pixel P.

The data processing circuit 150 described above may be referred to as a timing controller.

Figure 3:
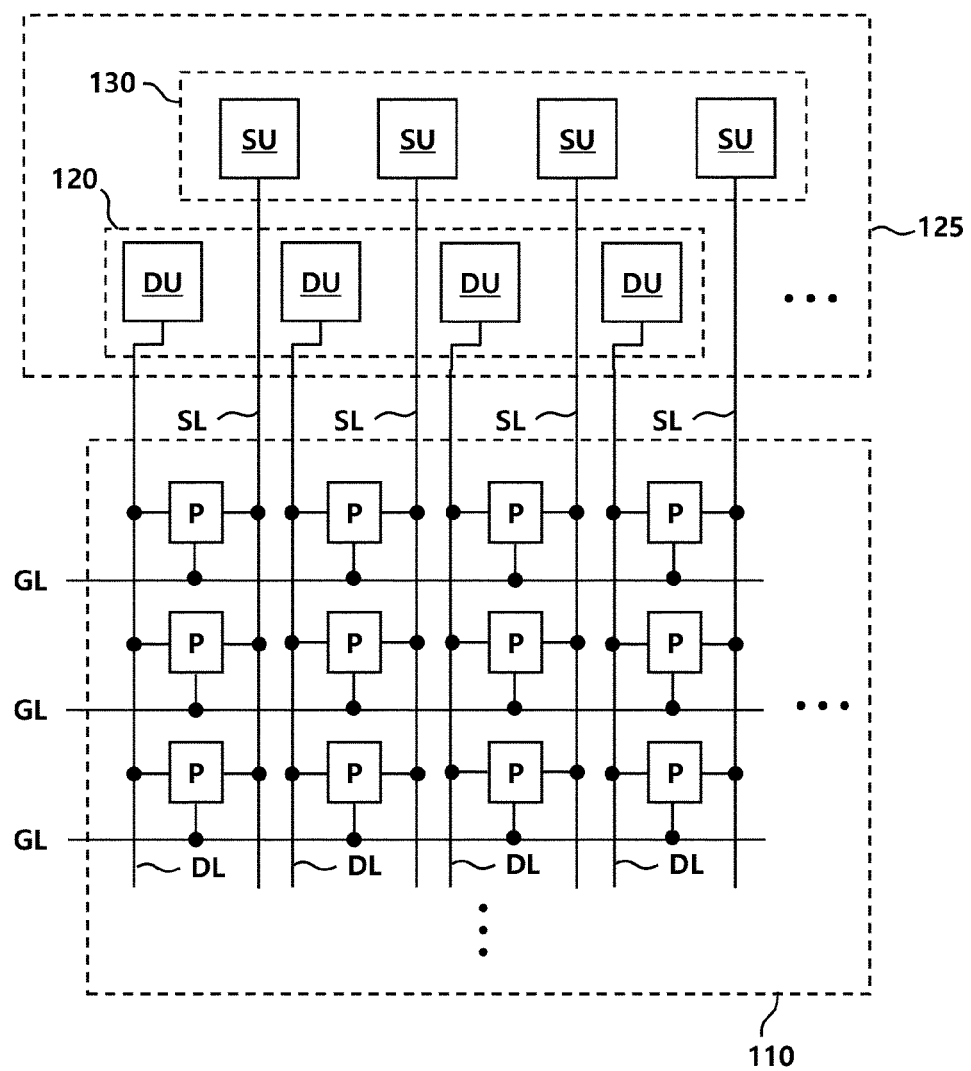
FIG. 3 is a view illustrating a configuration of a general display panel and a source driver IC.

Meanwhile, in the general display device 100, as shown in FIG. 3, the data driving circuit 120 included in the source driver IC 125 may include a plurality of data channel circuits DU arranged for each data line DL of the display panel 110 and the pixel sensing circuit 130 includes a plurality of sensing channel circuits SU arranged for each sensing line SL, and thus, an area of the source driver IC 125 increases.

Here, the general display device 100 may be a large device having a large screen size, such as a TV (television) or a computer monitor, and the pixel sensing circuit 130 may be included in the source driver IC 125.

Therefore, even if a luminance deviation (e.g., screen spot) of the display panel 110 is detected in a light emission test included in a manufacturing process of the display panel, the luminance deviation may be compensated through the source driver IC 125 mounted on the display panel 110 and the data processing circuit 150 after the light emission test.

Figure 4:
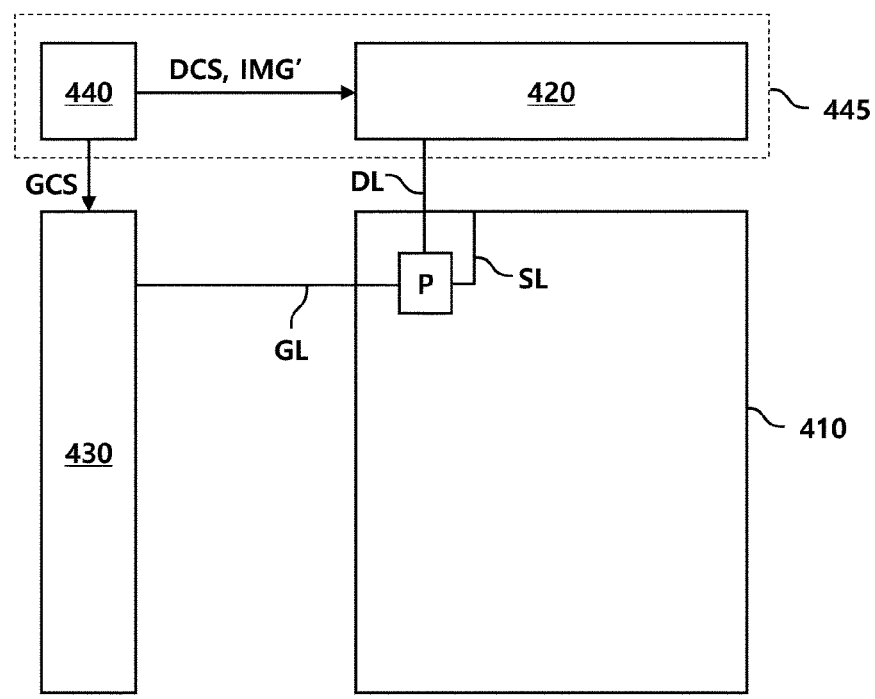
FIG. 4 is a block diagram of a display device according to an embodiment.

However, a small display device (400 of FIG. 4) having a small screen size such as a smartphone, a tablet PC, or a smart watch does not include a pixel sensing circuit in the source driver IC 420 as shown in FIG. 4 due to pixel characteristics of a thin film transistor (TFT) backplane, and may include only a data driving circuit. Here, the gate driver IC 430 may be the same as that of the related art.

Therefore, when a luminance deviation of the display panel 410 is detected in the light emission test of the display panel 410 of the small display device 400, there has been no way to correct the display panel 410 in which the luminance deviation exists until now, so that the display panel 410 having the luminance deviation was treated as defective, which lowers manufacturing yield of the display panel 410.

In an embodiment, a display panel of a small device having a luminance deviation may be corrected through the following panel inspection apparatus.

Figure 5:
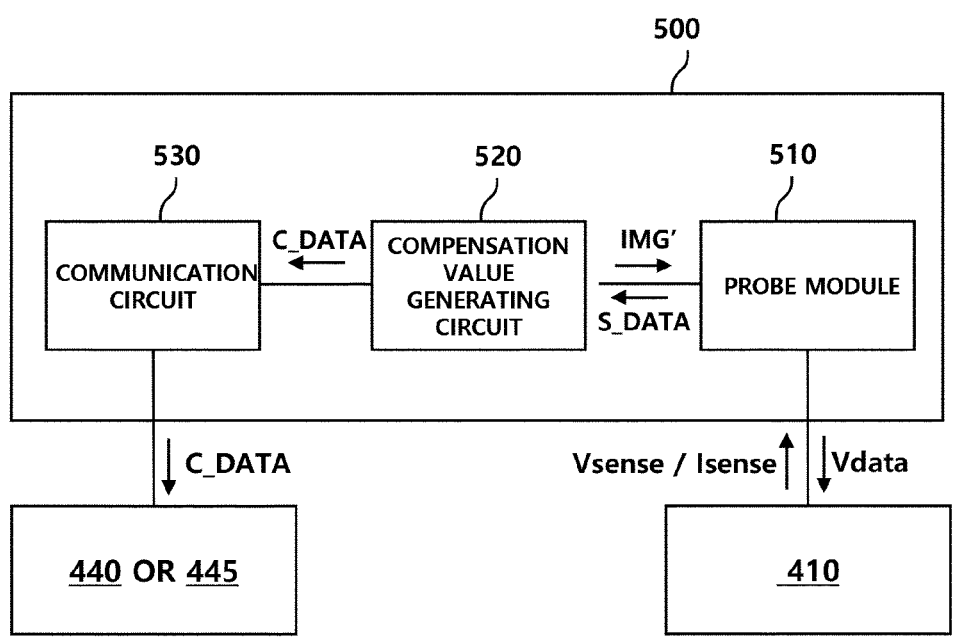
FIG. 5 is a block diagram of a panel inspection apparatus according to an embodiment.

FIG. 5 is a block diagram of a panel inspection apparatus according to an embodiment.

Referring to FIG. 5, a panel inspection apparatus 500 may include a probe module 510, a compensation value generating circuit 520, and a communication circuit 530, and may perform a driving test on the display panel 410.

The probe module 510 may be electrically connected to the display panel 410 for a driving test of the display panel 410 and may supply a data voltage Vdata for the driving test of the display panel 410. Here, the display panel 410 may be a display panel in which a luminance deviation is detected in a general light emission test, i.e., a light emission test in which the OLED included in the pixel P emits light by supplying only a static driving voltage (e.g., EVDD of FIG. 2) and a data voltage (Vdata of FIG. 2), and the driving test may be performed only on the display panel 410 in which luminance deviation is detected. Also, the display panel 410 connected to the probe module 510 may be in a state in which the source driver IC (420 of FIG. 4) and the timing controller (440 of FIG. 4) are not mounted. In other words, the display panel 410 may undergo the driving test in a state in which the source driver IC (420 of FIG. 4) and the timing controller (440 of FIG. 4) are not mounted.

Meanwhile, after the display panel 410 completes the light emission test or driving test, the source driver IC (420 of FIG. 4) mounted on the display panel 410 may not include a pixel sensing circuit. Here, the source driver IC (420 of FIG. 4) and the timing controller (440 of FIG. 4) may be individually mounted on the display panel 410. In addition, the source driver IC (420 of FIG. 4) and the timing controller (440 of FIG. 4) may be integrated into a single IC and the single integrated IC (445 of FIG. 4) may be mounted.

The driving test according to the embodiment may refer to a test in which the plurality of pixels arranged on the display panel 410 are driven according to a data voltage (Vdata of FIG. 2) supplied to the pixels together with the driving voltage (e.g., EVDD of FIG. 2) for the driving test.

As described above, when the probe module 510 supplies the data voltage Vdata to the plurality of pixels, the driving test of the display panel 410 starts. Here, the data voltage Vdata may be supplied to the pixels through the data line DL of the display panel 410 as shown in FIG. 4.

In addition, the probe module 510 may receive the image data IMG' for the driving test of the display panel 410 from the compensation value generating circuit 520 and generate the data voltage Vdata corresponding to the image data.

In an embodiment, during the driving test of the display panel 410, the probe module 510 may sense a characteristic value generated in each of the plurality of pixels.

In other words, when an analog signal Vsense or Isense is transmitted to the probe module 510 through the sensing line SL of the display panel 410 connected to the plurality of pixels during the driving test of the display panel 410, the probe module 510 may sense (measure) the characteristic value of each of a plurality of pixels using the analog signal (Vsense or Isense).

The probe module 510 may generate pixel sensing data, which is digital data including the characteristic value of each of a plurality of pixels. In addition, the probe module 510 may transmit pixel sensing data to the compensation value generating circuit 520.

The compensation value generating circuit 520 may transmit the image data IMG' for the driving test of the display panel 410 to the probe module 510. Here, the compensation value generating circuit 520 may transmit the image data IMG' to the probe module 510 when the probe module 510 is electrically connected to the display panel 410.

In an embodiment, the image data IMG' for the driving test may be data corresponding to a monochromatic image.

For example, the monochromatic image may be an image in which the entire display panel 410 is displayed in white, an image in which the entire display panel 410 is displayed in red, an image in which the entire display panel 410 is displayed in green, or an image in which the entire display panel 410 is displayed in blue.

In addition, in the light emission test, a grayscale is fixed, but in the driving test, the grayscale in the image corresponding to the image data IMG' may be changed every predetermined time.

After transmitting the image data IMG' to the probe module 510, the compensation value generating circuit 520 may receive pixel sensing data from the probe module 510 during the driving test of the display panel 410.

In addition, the compensation value generating circuit 520 may select one or more pixels having a characteristic value deviation from among a plurality of pixels using the pixel sensing data.

Thereafter, the compensation value generating circuit 520 may generate compensation value data for compensating for a characteristic value deviation of one or more pixels. In other words, the compensation value generating circuit 520 may generate compensation value data C_DATA for compensating for a luminance deviation existing in the display panel 410.

In an embodiment, the compensation value generating circuit 520 may previously store a reference value for selecting one or more pixels having a characteristic value deviation.

The compensation value generating circuit 520 may compare the characteristic value of each of a plurality of pixels included in the pixel sensing data with the reference value and select one or more pixels having a deviation from the reference value.

Here, the reference value may be a characteristic value generated when the pixel in a normal state receives the data voltage Vdata for the driving test. This reference value may be determined through a number of experiments.

In an embodiment, the compensation value generating circuit 520 may compare the characteristic values of the plurality of pixels included in the pixel sensing data and select one or more pixels having a characteristic value deviation from pixels having uniform characteristic values.

In other words, the compensation value generating circuit 520 may compare the characteristic values of the plurality of pixels with each other and determine whether the characteristic values of the plurality of pixels are uniform. Through this, the compensation value generating circuit 520 may select one or more pixels having a deviation from the uniform characteristic values of pixels having the uniform characteristic values.

In an embodiment, the compensation value generating circuit 520 may generate compensation value data in the form of a look-up table. The look-up table may include one or more weights for compensating for each of characteristic value deviations of one or more pixels.

In an embodiment, when the compensation value generating circuit 520 generates the compensation value data C_DATA, the driving test may be terminated.

After the driving test is completed, the compensation value generating circuit 520 may transmit the compensation value data C_DATA to a memory of the timing controller (440 of FIG. 4) which is an IC or a memory of the integrated IC 445 in which the timing controller 440 and the source driver IC 420 are integrated.

Here, a timing at which the timing controller 440 which is an IC or the integrated IC 445 is mounted on the display panel 410 may be after the driving test.

In other words, after the driving test is completed and the compensation value generating circuit 520 stores the compensation value data C_DATA in the memory of the timing controller 440 or the memory of the integrated IC 445, the timing controller 440 or the integrated IC 445 may be mounted on the display panel 410.

When the timing controller 440 or the integrated IC 445 storing the compensation value data C_DATA is mounted on the display panel 410 as described above, the timing controller 440 may perform compensation on general image data using the compensation value data C_DATA when processing the general image data. Accordingly, when a screen corresponding to the general image data is displayed on the display panel 410, the luminance deviation of the display panel 410 may be corrected.

The communication circuit 530 may be electrically connected to the timing controller 440 or the integrated IC 445. In this state, the communication circuit 530 may receive the compensation value data C_DATA from the compensation value generating circuit 520. In addition, the communication circuit 530 may transmit the compensation value data C_DATA to the memory of the timing controller 440 or the integrated IC 445.

Here, the timing controller 440 or the integrated IC 445, not mounted on the display panel 410, may be electrically connected to the communication circuit 530.

As described above, if a luminance deviation is detected in the display panel 410 during the manufacturing process of the display panel 410 on which the source driver IC (420 of FIG. 4) without the pixel sensing circuit is mounted, the panel inspection apparatus 500 senses the pixels of the display panel 410 to generate the compensation value data C_DATA and store the compensation value data C_DATA in the memory of the timing controller 440 or the integrated IC 445 to correct the luminance deviation of the display panel 410, thereby improving manufacturing yield of the display panel 410.

Although not shown in FIG. 5, a component capable of performing a function of a gate driver IC during a driving test may be included in the panel inspection apparatus 500.

In addition, although the panel inspection apparatus 500 is illustrated as including one probe module 510 in FIG. 5, the present embodiment is not limited thereto and the panel inspection apparatus 500 may include a plurality of probe modules to simultaneously perform driving test and correction on a plurality of display panels.

Hereinafter, a configuration of the probe module 510 for sensing pixels in the panel inspection apparatus 500 is described.

Figure 6:
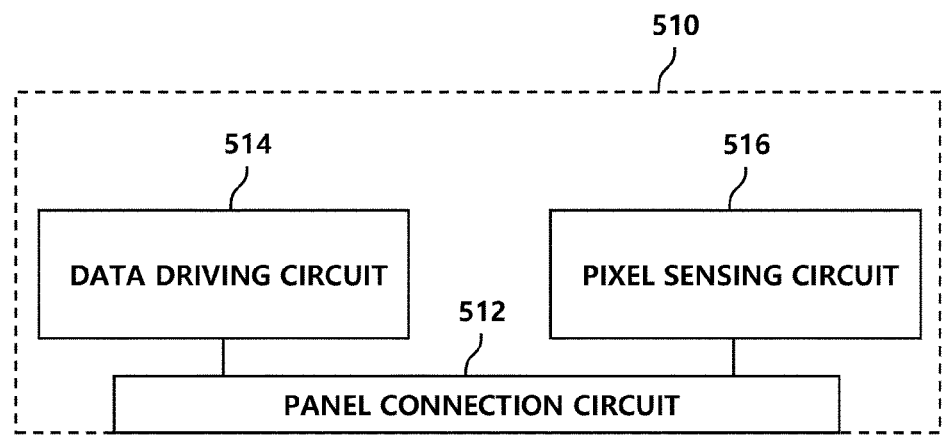
FIGS. 6 and 7 are configuration diagrams of a probe module according to an embodiment.
Figure 7:
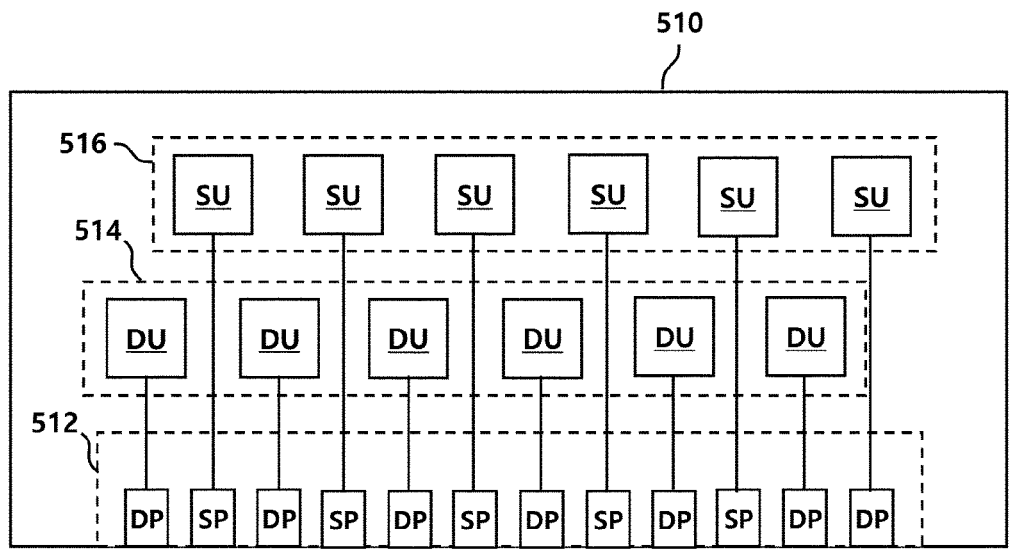

FIGS. 6 and 7 are block diagrams of a probe module according to an embodiment.

First, referring to FIG. 6, the probe module 510 may include a panel connection circuit 512, a data driving circuit 514, and a pixel sensing circuit 516.

The panel connection circuit 512 electrically connects the data driving circuit 514 to the plurality of pixels arranged on the display panel 410 and electrically connects the pixel sensing circuit 516 to the plurality of pixels. Here, the display panel 410 may be in a state in which the source driver IC (420 of FIG. 4) and the timing controller (440 of FIG. 4) are not mounted thereon.

In an embodiment, the panel connection circuit 512 may include a plurality of data line connection pads DP for electrically connecting the data driving circuit 514 to the plurality of pixels and a plurality of sensing line connection pads SP for electrically connecting the pixel sensing circuit 516 to the plurality of pixels as shown in FIG. 7.

Here, the data line connection pads DP and the sensing line connection pads SP may be alternately arranged as shown in FIG. 7.

Figure 8:
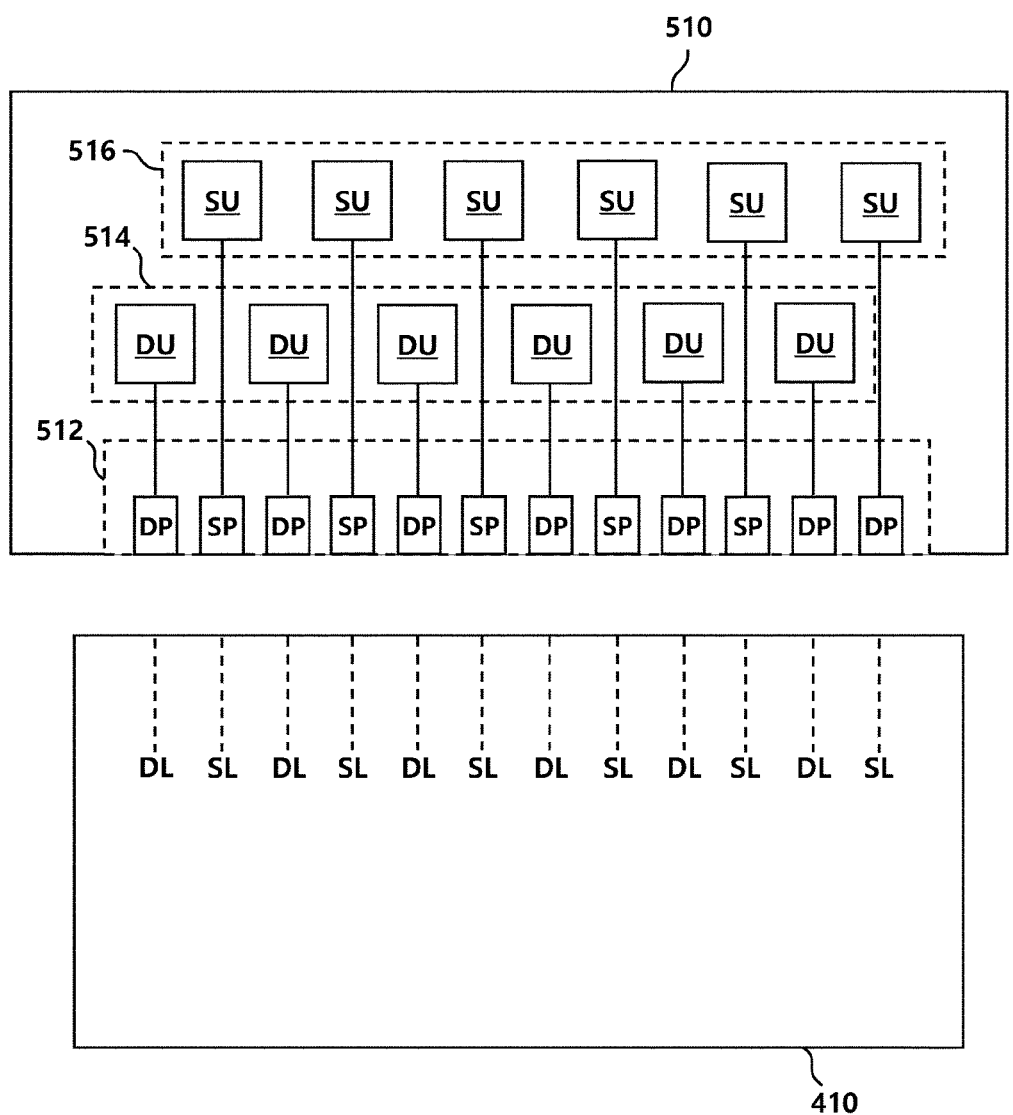
FIG. 8 is a view illustrating a configuration of connecting a probe module to a display panel according to an embodiment.

Through this, as shown in FIG. 8, it may be electrically connected to the data line DL and the sensing line SL which are alternately arranged on the display panel 410.

In an embodiment, the number of the plurality of data line connection pads DP may be equal to or less than the number of the plurality of data lines DL arranged on the display panel 410, and the number of the plurality of sensing line connection pads SP may be equal to or less than the number of the plurality of sensing lines SL disposed on the display panel 410.

When a multiplexer is connected to two or more data lines DL in the display panel 410, the number of the plurality of data line connection pads DP may be less than the number of the plurality of data lines DL.

When the multiplexer is connected to two or more sensing lines SL in the display panel 410, the number of the plurality of sensing line connection pads SP may be less than the number of the plurality of sensing lines SL.

Here, the plurality of sensing lines SL arranged on the display panel 410 may be electrically connected to the pixel sensing circuit 516 only during the driving test of the display panel 410.

Also, since the source driver IC 420 mounted on the display panel 410 does not include a pixel sensing circuit, the source driver IC 420 may be electrically connected to only the plurality of data lines DL.

The data driving circuit 514 may receive the image data IMG' for the driving test of the display panel 410 from the compensation value generating circuit 520.

In addition, the data driving circuit 514 may generate a data voltage corresponding to the image data IMG' and subsequently supply the data voltage to the plurality of pixels arranged on the display panel 410.

The data driving circuit 514 described above may include a plurality of data channel circuits DU arranged for each data line connection pad DP as shown in FIG. 7.

The pixel sensing circuit 516 may sense a characteristic value generated from each of the plurality of pixels to which the data voltage is supplied.

In other words, when an analog signal Vsense or Isense is transmitted to the pixel sensing circuit 516 through the sensing line SL of the display panel 410 connected to the plurality of pixels during the driving test of the display panel 410, the pixel sensing circuit 516 may sense (measure) a characteristic value of each of the plurality of pixels using an analog signal (Vsense or Isense).

The pixel sensing circuit 516 sensing the characteristic value of each of the plurality of pixels may generate pixel sensing data which is digital data including the characteristic value of each of the plurality of pixels. In addition, the pixel sensing circuit 516 may transmit the pixel sensing data to the compensation value generating circuit 520.

The pixel sensing circuit 516 as described above may include a plurality of sensing channel circuits SU arranged for each sensing line connection pad SP.

In an embodiment, when the characteristic value of each of the plurality of pixels includes a current characteristic value, the pixel sensing circuit 516 may include one or more current integrating circuits and sample and hold circuits for sensing the current characteristic value of each of the plurality of pixels. Here, the current integrating circuit and the sample and hold circuit may be arranged for each sensing channel circuit SU.

The pixel sensing circuit 516 may include one or more current comparison circuits instead of the sample and hold circuit.

Hereinafter, a process of correcting a luminance deviation of the display panel 410 in the panel inspection apparatus 500 according to an embodiment is described.

Figure 9:
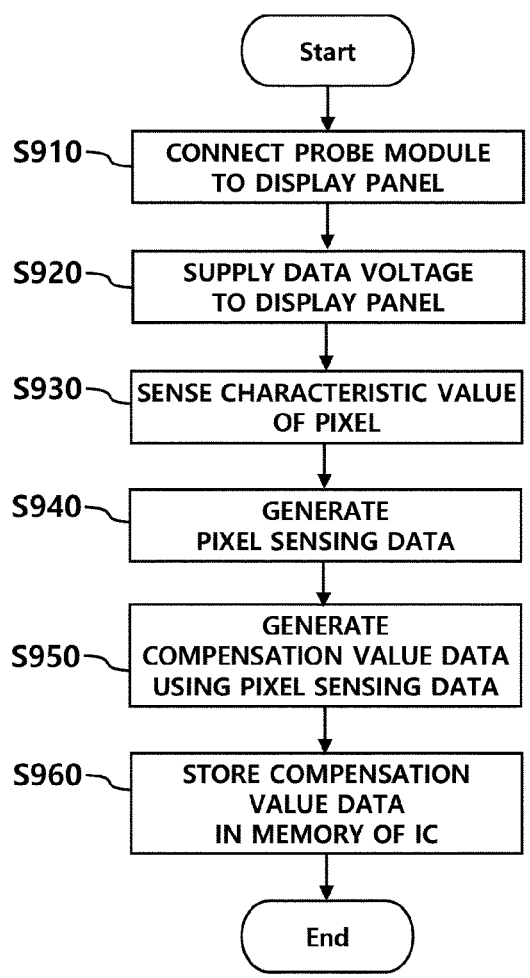
FIG. 9 is a flowchart illustrating a process of correcting a display panel in a panel inspection apparatus according to an embodiment.

FIG. 9 is a flowchart illustrating a process of correcting a display panel in a panel inspection apparatus according to an embodiment.

First, the panel inspection apparatus 500 is electrically connected to the display panel 410 through the probe module 510 (S910). Here, the display panel 410 may be a panel on which an IC is not mounted. In addition, the panel may be a panel in which a luminance deviation is detected in the light emission test performed before step S910.

In an embodiment, the IC may include the source driver IC 420 and the timing controller 440. In other words, the IC may be an IC 445 in which the source driver IC 420 and the timing controller 440 are integrated, or may be a separate source driver IC 420 and the timing controller 440. Also, the source driver IC 420 may not include a pixel sensing circuit.

After step S910, the panel inspection apparatus 500 may start a driving test by supplying a data voltage for a driving test to the plurality of pixels arranged on the display panel 410 (S920). Here, the data voltage, which is a voltage corresponding to a monochromatic image, may have the same voltage value for each pixel.

When the data voltage is supplied to the plurality of pixels, the panel inspection apparatus 500 may receive an analog signal Vsense or Isense through the sensing line SL of the display panel 410 connected to the plurality of pixels and may sense the characteristic value of each of the plurality of pixels using the analog signal Vsense or Isense (S930).

The panel inspection apparatus 500 may generate pixel sensing data including the characteristic value of each of the plurality of pixels (S940).

In addition, the panel inspection apparatus 500 may select one or more pixels having a characteristic value deviation from among the plurality of pixels using the pixel sensing data and may generate compensation value data C_DATA for compensating for the characteristic value deviation (S950). In step S950, the panel inspection apparatus 500 may previously store a reference value for selecting one or more pixels having a characteristic value deviation and compare the characteristic value of each of the plurality of pixels included in the pixel sensing data with the reference value to select one or more pixels having a deviation with the reference value.

In step S950, the panel inspection apparatus 500 may compare the characteristic values of the plurality of pixels included in the pixel sensing data with each other to select one or more pixels having a characteristic value deviation from pixels having uniform characteristic values.

When the panel inspection apparatus 500 generates the compensation value data C_DATA in step S950, the driving test may be terminated. In other words, after the panel inspection apparatus 500 generates the compensation value data C_DATA in step S950, supply of the data voltage may be stopped.

After the step S950, the panel inspection apparatus 500 may store the compensation value data C_DATA in the memory of the timing controller (440 of FIG. 4) which is an IC or the memory of the integrated IC 445 in which the timing controller 440 and the source driver IC 420 are integrated (S960).

Here, the timing controller 440 which is an IC or the integrated IC 445 may be mounted on the display panel 410 after storing the compensation value data C_DATA.

When the timing controller 440 or the integrated IC 445 storing the compensation value data C_DATA is mounted on the display panel 410 as described above, the timing controller 440 may perform compensation on general image data using the compensation value data C_DATA when processing the general image data. Accordingly, when a screen corresponding to the general image data is displayed on the display panel 410, the luminance deviation of the display panel 410 may be corrected.

What is claimed is:

1. A panel inspection apparatus comprising:
    a probe module comprising a pixel sensing circuit, wherein
        the pixel sensing circuit is configured to sense a characteristic value generated in each of a plurality of pixels arranged in a display panel, and generate and transmit pixel sensing data including the characteristic value of the each of the plurality of pixels, and
        the pixel sensing data is generated and transmitted during a driving test of the display panel and before an integrated circuit (IC) including a source driver and a timing controller is mounted on the display panel;
    a compensation value generating circuit configured to:
        receive the pixel sensing data from the probe module;
        based on the pixel sensing data, select one or more pixels each having a characteristic value deviated from characteristic values of other pixels included in deviation from the plurality of pixels using the pixel sensing data,; and
        generate compensation value data for compensating for the deviated characteristic values of the selected one or more pixels during the driving test; and
    a communication circuit configured to transmit the compensation value data to a memory of the IC including the source driver and the timing controller, wherein
    the compensation value data is transmitted to the memory of the IC after the driving test and before the IC including the source driver and the timing controller is mounted on the display panel,
    during the driving test, the compensation value generating circuit is configured to transmit image data for the driving test to the probe module, and the probe module is configured to generate a data voltage corresponding to the image data and supply the generated data voltage to the plurality of pixels, and
    the data voltage has a data voltage value corresponding to a monochromatic image.

2. The panel inspection apparatus of claim 1, wherein the compensation value generating circuit is configured to previously store, as a reference value, a characteristic value generated when a pixel in a normal state receives the data voltage and compare the characteristic value of each of the plurality of pixels included in the pixel sensing data with the reference value to select the one or more pixels.

3. The panel inspection apparatus of claim 1, wherein the compensation value generating circuit is configured to compare the characteristic values of the plurality of pixels included in the pixel sensing data with each other to select the one or more pixels.

4. The panel inspection apparatus of claim 1, wherein the compensation value generating circuit is configured to generate the compensation value data in a form of a look-up table.

5. A panel correction method of a panel inspection apparatus including a probe module, the panel correction method comprising:
    electrically connecting the probe module to a display panel on which a plurality of pixels are arranged, wherein at the time the probe module is electrically connected to the display panel, an integrated circuit (IC) including a source driver and a timing controller is not mounted on the display panel is electrically connected;
    generating and transmitting to the plurality of pixels a data voltage for a driving test of the display panel;
    sensing a characteristic value generated in each of the plurality of pixels receiving the data voltage;
    selecting one or more pixels each having a characteristic value deviated from characteristic values of other pixels included in the plurality of pixels;
    generating compensation value data for compensating for the deviated characteristic values of the one or more pixels during the driving test; and
    storing the compensation value data in a memory of the IC after the driving test and before the IC including the source driver and the timing controller is mounted on the display panel, wherein
    the data voltage has a data voltage value corresponding to a monochromatic image.

6. The panel correction method of claim 5, wherein after storing, the compensation value data in the memory of the IC, the IC is mounted on the display panel.

* * * * *